United States Patent
Miyata

(10) Patent No.: US 12,424,821 B2
(45) Date of Patent: Sep. 23, 2025

(54) LIGHT EMITTING DEVICE

(71) Applicant: NICHIA CORPORATION, Anan (JP)

(72) Inventor: Tadaaki Miyata, Yokohama (JP)

(73) Assignee: NICHIA CORPORATION, Anan (JP)

( * ) Notice: Subject to any disclaimer, the term of this patent is extended or adjusted under 35 U.S.C. 154(b) by 734 days.

(21) Appl. No.: 17/730,101

(22) Filed: Apr. 26, 2022

(65) Prior Publication Data

US 2022/0344903 A1   Oct. 27, 2022

(30) Foreign Application Priority Data

Apr. 27, 2021   (JP) .................. 2021-074752

(51) Int. Cl.
*H01S 5/10*   (2021.01)
*H01S 5/40*   (2006.01)

(52) U.S. Cl.
CPC ............ *H01S 5/1014* (2013.01); *H01S 5/101* (2013.01); *H01S 5/4093* (2013.01)

(58) Field of Classification Search
CPC ............................... H01S 5/101; H01S 5/4093
USPC ........................................................ 372/109
See application file for complete search history.

(56) References Cited

U.S. PATENT DOCUMENTS

| | | | | |
|---|---|---|---|---|
| 11,493,760 B2 * | 11/2022 | Grief | ........................ | G02B 6/42 |
| 2001/0028769 A1 * | 10/2001 | Deacon | ................... | G02F 1/011 |
| | | | | 385/37 |

| | | | |
|---|---|---|---|
| 2008/0212091 A1 | 9/2008 | Tanaka et al. | |
| 2011/0228404 A1 | 9/2011 | Webb et al. | |
| 2012/0147361 A1 | 6/2012 | Mochizuki et al. | |
| 2021/0149110 A1 | 5/2021 | Katsuyama et al. | |
| 2021/0392308 A1 | 12/2021 | Huebel et al. | |
| 2023/0358978 A1 | 11/2023 | Shoda et al. | |

FOREIGN PATENT DOCUMENTS

| | | |
|---|---|---|
| JP | S61-122613 A | 6/1986 |
| JP | 2001-194551 A | 7/2001 |
| JP | 2006-189705 A | 7/2006 |
| JP | 2008-180650 A | 8/2008 |
| JP | 2009-147154 A | 7/2009 |
| JP | 2012-129259 A | 7/2012 |
| JP | 2013-073080 A | 4/2013 |
| JP | 2021-043352 A | 3/2021 |
| WO | 2017/090333 A1 | 6/2017 |
| WO | 2020/078735 A1 | 4/2020 |
| WO | 2020/184106 A1 | 9/2020 |
| WO | 2021/261232 A1 | 12/2021 |

* cited by examiner

*Primary Examiner* — Julian D Huffman
(74) *Attorney, Agent, or Firm* — Global IP Counselors, LLP

(57) ABSTRACT

A light emitting device includes: laser diodes (LDs); a planar lightwave circuit (PLC) including optical waveguides; and a lens. The optical waveguides include: a first optical waveguide to receive first light emitted from a first LD and to emit the first light from a first light-exiting end; and a second optical waveguide to receive second light emitted from a second LD and to emit the second light from a second light-exiting end. The first light-exiting end causes refraction such that the first light exits in a first direction. The second light-exiting end causes refraction such that the second light exits in a second direction. A distance from the first light-exiting end to the lens along the first direction is shorter than a distance from the second light-exiting end to the lens along the second direction.

19 Claims, 10 Drawing Sheets

LIGHT EMITTING DEVICE

CROSS-REFERENCE TO RELATED APPLICATION

This application claims priority to Japanese Patent Application No. 2021-074752, filed on Apr. 27, 2021, the entire contents of which are hereby incorporated herein by reference.

BACKGROUND

The present disclosure relates to a light emitting device.

Applications for light emitting devices that include a laser diode (semiconductor laser device) are expanding into various fields. Japanese Laid-Open Patent Publication No. 2006-189705 describes a device which modulates laser light beams emitted from a plurality of laser diodes through an optical waveguide array, for recording onto a photosensitive material.

SUMMARY

The present disclosure provides a light emitting device which realizes an emission-point pitch and emission positions that are difficult to achieve with a single laser diode (LD) and which permits downsizing.

In an illustrative embodiment, a light emitting device according to the present disclosure includes a plurality of laser diodes, a planar lightwave circuit, and a lens. The plurality of laser diodes are aligned along a predetermined direction. The plurality of laser diodes include a first laser diode and a second laser diode. The first laser diode is configured to oscillate at a first peak wavelength to emit first light. The second laser diode is configured to oscillate at a second peak wavelength to emit second light. The second peak wavelength is longer than the first peak wavelength. The planar lightwave circuit includes a first optical waveguide and a second optical waveguide. The first; optical waveguide is configured to receive the first light at a first light-incident end, to guide the first light, and to emit the first light from a first light-exiting end with the first light being refracted at the first light-exiting end to exit in a first direction which is inclined with respect to a normal direction of the first light-exiting end. The second optical waveguide is configured to receive the second light at a second light-incident end, to guide the second light, and to emit the second light from a second light-exiting end with the second light being refracted at the second light-exiting end to exit in a second direction which is inclined with respect to a normal direction of the second light-exiting end. A center-to-center distance between the first light-exiting end and the second light-exiting end is shorter than a center-to-center distance between the first light-incident end and the second light-incident end. The first light exiting from the first light-exiting end and the second light exiting from the second light-exiting end are incident to the lens. The lens is arranged with respect to the planar lightwave circuit so that a first distance from the first light-exiting end to a surface of the lens along the first direction is shorter than a second distance from the second light-exiting end to the surface of the lens along the second direction.

According to an embodiment of the present disclosure, there is provided a light emitting device which realizes an emission-point pitch and emission positions that are difficult to achieve with a single laser diode (LD) and which permits downsizing.

DETAILED DESCRIPTION

With reference to FIG. 1, FIG. 2A, FIG. 2B, and FIG. 3, the fundamental example structure of a light emitting device according to an embodiment of the present disclosure will be described. In the figures, the X axis, the Y axis, and the Z axis, which are orthogonal to one another, are schematically shown for reference sake.

Figure 1:
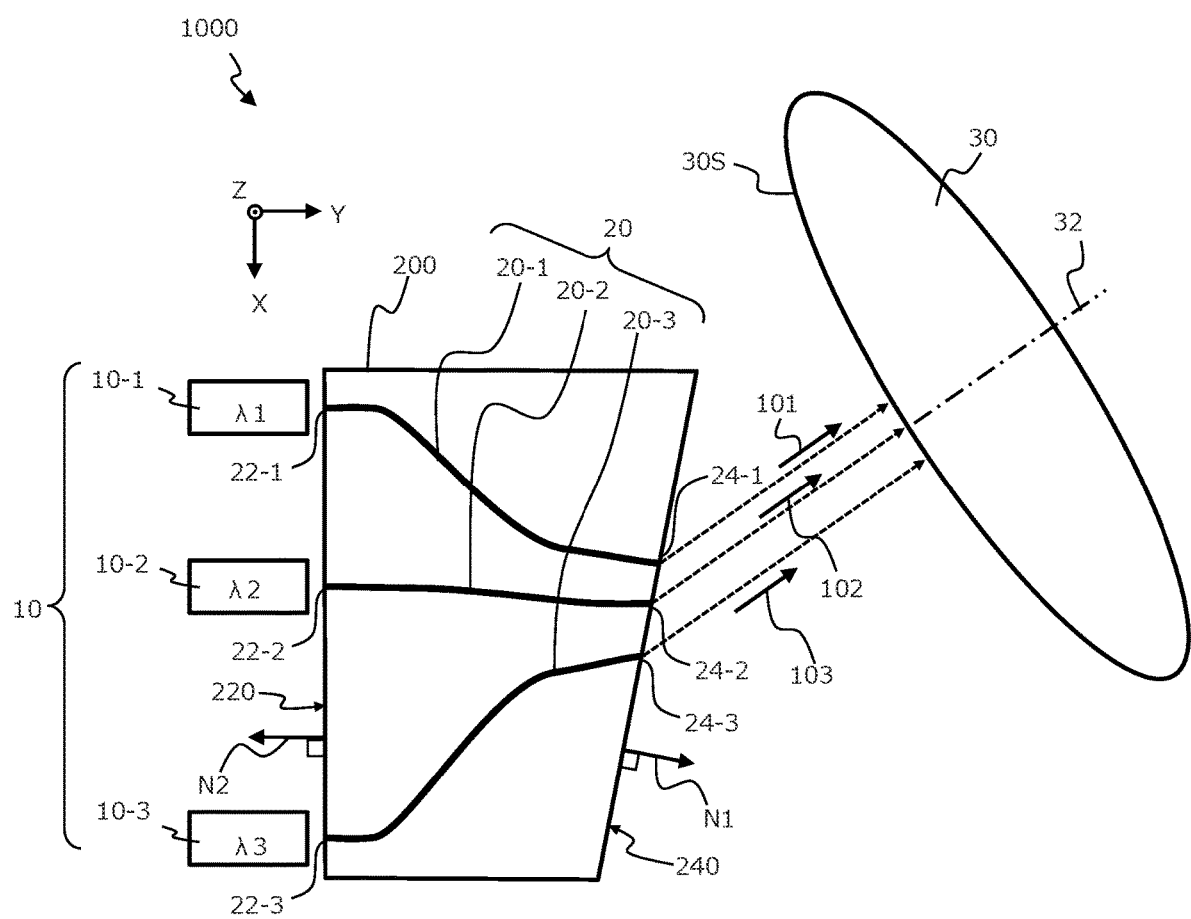
FIG. 1 is a plan view schematically showing an example structure of a light emitting device according to an embodiment of the present disclosure.

First, FIG. 1 is referred to FIG. 1 is a plan view schematically showing an example structure of a light emitting device according to the present embodiment. The light emitting device 1000 shown in FIG. 1 includes a plurality of laser diodes 10 that are arranged along a predetermined direction (e.g., the X axis direction in FIG. 1). Although the plurality of laser diodes 10 in FIG. 1 are illustrated as identical in shape and size to one another, they may differ in shape or size from one another. In the illustrated example, the plurality of laser diodes 10 include a first laser diode 10-1, a second laser diode 10-2, and a third laser diode 10-3. The number of laser diodes 10 is not limited to three; there may be two laser diodes 10, or four or more laser diodes 10. The first laser diode 10-1 oscillates at a first peak wavelength $\lambda 1$. The second laser diode 10-2 oscillates at a second peak wavelength $\lambda 2$ which is longer than the first peak wavelength $\lambda 1$. The third laser diode 10-3 oscillates at a third peak wavelength $\lambda 3$ which is longer than the second peak wavelength λ2. Thus, in the present embodiment, laser light beams of respectively different peak wavelengths are emitted from the plurality of laser diodes 10. Therefore, the light emitting device 1000 according to the present embodiment may be referred to as a "multi-wavelength light source". In the case where such a multi-wavelength light source is used as a light source of a display device, the first peak wavelength λ1 may be in the range of e.g. 400 nm to 495 nm; the second peak wavelength λ2 may be in the range of e.g. 495 nm to 600 nm; and the third peak wavelength λ3 may be in the range of e.g. 600 nm to 750 nm.

Note that the plurality of laser diodes 10 may include a fourth laser diode that oscillates at a fourth peak wavelength λ4 which is different from all of the first peak wavelength λ1, the second peak wavelength λ2, and the third peak wavelength λ3.

The first peak wavelength λ1, the second peak wavelength λ2, the third peak wavelength λ3, and the fourth peak wavelength λ4 may all be contained in the visible light region; alternatively, any of these peak wavelengths may be outside the visible light region. For example, the fourth peak wavelength λ4 may be in the range of 780 nm to 2000 nm, which is in the infrared region. When the fourth peak wavelength λ4 is in the infrared region, the light emitting device can be used as an invisible sensor light source which allows sensing without affecting visual observation.

The light emitting device 1000 further includes: a planar lightwave circuit (PLC) 200 that includes a plurality of optical waveguides 20 to guide light emitted from the plurality of laser diodes 10; and a lens 30 to which the light exiting from the plurality of optical waveguides 20 is incident. A lens may be disposed between the plurality of laser diodes 10 and the PLC 200. The structure of each optical waveguide 20 is not particularly limited, and any arbitrary structure for realizing the functionality of an optical waveguide may be adopted. For example, the PLC 200 may include a substrate, a waveguide core provided on the substrate, and a cladding layer covering the waveguide core. The substrate, the waveguide core, and the cladding layer are made of an inorganic material such as silicon or quartz, or an organic material such as a plastic or a resin. For example, in the case where the substrate is made of an inorganic material, the waveguide core and the cladding layer may also be made of inorganic materials. In the case where the substrate is made of a resin material, the waveguide core and the cladding layer may also be made of resin materials. In the case where the waveguide core and the cladding layer are made of polymers, examples of the polymers include PMMA (polymethyl methacrylate), polyimide-based resins, silicone-based resins, polystyrene-based resins, polycarbonate-based resins, polyamine-based resins, polyester-based resins, phenol-based resins, polyquinoline-based resins, polyquinoxaline-based resins, polybenzoxazole-based resins, polybenzothiazole-based resins, and polybenzimidazole-based resins. Examples of polyimide-based resins include polyimide resins, poly(imide isoindologuinazoline dionimide) resins, polyetherimide resins, polyetherketone resins, and polyesterimide resins.

The waveguide core is made of a material having a higher refractive index than that of the surroundings, and thus is able to exhibit a light confinement effect. The respective light beams exiting from the plurality of optical waveguides 20 travel in the directions of broken lines shown in FIG. 1, while diverging at predetermined angles.

The lens 30 may be a collimating lens, for example. The lens 30 has a lens surface that causes the angle of spread (divergence angle) of the light exiting from the plurality of optical waveguides 20 of the PLC 200 to be reduced through refraction. Such a lens surface is formed on at least one of the light-incident side and the light-exiting side of the lens 30. The shape of the lens surface is not limited to a spherical surface but may also be an aspherical surface. The light having been transmitted through the lens 30 does not need to be a parallel beam in the strict sense; alternatively, the light may be allowed to converge or diverge through a combination with other optics. In the illustrated example, an optical axis direction 32 of the lens 30 is inclined by e.g. not less than 25 degrees and not more than 85 degrees, with respect to a predetermined direction (i.e., the axis direction) along which the laser diodes 10 are arranged. Preferably, the lens 30 has: a numerical aperture (NA) of not less than 0.1 and not more than 0.7, preferably not less than 0.2 and not more than 0.6; and a focal length of not less than 0.5 mm and not more than 10 mm, preferably not less than 1 mm and not more than 5 mm.

The light beams of different peak wavelengths exiting from the plurality of optical waveguides 20 are incident on the lens 30 while overlapping one another. When the focal length (given a light wavelength of 455 nm) of the lens 30 is e.g. 3 mm, the beam diameter (diameter) of light incident on the lens 30 may be e.g. not less than 0.9 nm and not more than 5 mm at the position of the surface 30S of the lens 30. The surface. 30S of the lens 30 does not need to be a curved surface that functions as a lens surface, but may instead be a plane.

In the present embodiment, the plurality of optical waveguides 20 of the PLC 200 include a first optical waveguide 20-1, a second optical waveguide 20-2, and a third optical waveguide 20-3. The first optical waveguide 20-1 receives first light that is emitted from the first laser diode 10-1 at a first light-incident end 22-1, and emits the first light from a first light-exiting end 24-1. The second optical waveguide 20-2 receives second light that is emitted from the second laser diode 10-2 at a second light-incident end 22-2, and emits the second light from a second light-exiting end 24-2. The third optical waveguide 20-3 receives third light that is emitted from the third laser diode 10-3 at a third light-incident end 22-3, and emits the third light from a third light-exiting end 24-3. In the case where the light emitting device 1000 further includes a fourth laser diode, the plurality of optical waveguides 20 may include a fourth optical waveguide that receives fourth light emitted from the fourth laser diode at a fourth light-incident end and emits the fourth light from a fourth light-exiting end. The first to fourth light beams are preferably incident on the first to fourth light-incident ends at a perpendicular angle, although this is not a limitation.

The PLC 200 has a light incident surface 220 that includes the first light-incident end 22-1, the second light-incident end 22-2, and the third light-incident end 22-3. The PLC 200 also has a light-exiting surface 240 that includes the first light-exiting end 24-1, the second light-exiting end 24-2, and the third light-exiting end 24-3. In the present embodiment, in a plan view, both of the light incident surface 220 and the light-exiting surface 240 of the PLC 200 extend linearly. As shown in FIG. 1, a normal direction N1 of the light-exiting surface 240 of the PLC 200 is inclined with respect to the optical axis direction 32 of the lens 30. In the illustrated example, the normal direction N1 of the light-exiting surface 240 of the PLC 200 is inclined with respect also to a normal direction N2 of the light incident surface 220. In other words, the light incident surface 220 of the PLC 200 and the light-exiting surface 240 are in a non-parallel relationship. In the present disclosure, two directions being "inclined" with respect to each other means that the angle between the two directions is not less than 5 degrees and not more than 85 degrees.

Figure 2A:
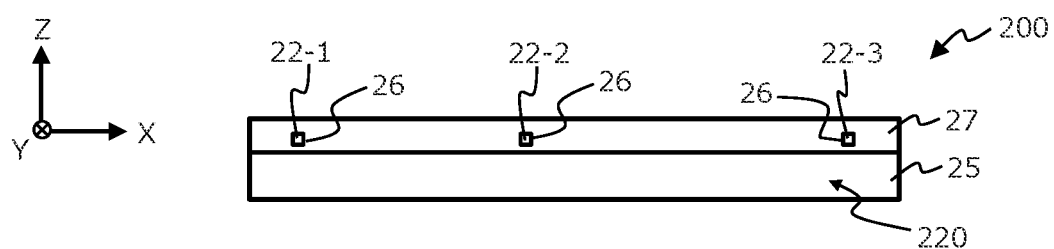
FIG. 2A is a diagram showing the light emitting device of FIG. 1, in which a planar lightwave circuit (PLC) is viewed from the negative direction of the Y axis.
Figure 2B:
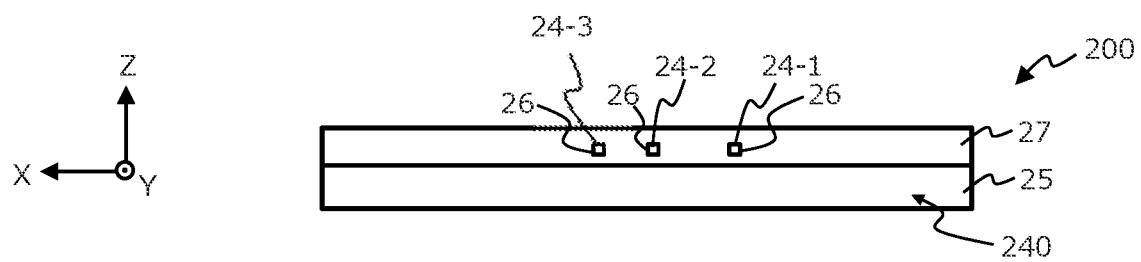
FIG. 2B is a diagram showing a light-exiting surface, in which the PLC of the light emitting device of FIG. 1 is viewed from the positive direction of the Y axis.

Next, FIG. 2A and FIG. 2B are referred to FIG. 2A is a diagram showing the light incident surface 220, in which the PLC 200 is viewed from the negative direction of the Y axis. FIG. 2B is a diagram showing the light-exiting surface 240, in which the PLC 200 is viewed from the positive direction of the Y axis. In the illustrated example, the PLC 200 includes a substrate 25, a plurality of waveguide cores 26 provided on the substrate 25, and a cladding layer 27 covering the waveguide cores 26. The substrate 25 may have an undercladding layer on its surface. The cladding layer 27 covering the waveguide cores 26 functions as an overcladding layer. The thickness of each of the undercladding layer and the overcladding layer may be not less than 10 μm and not more than 100 μm, for example. The height (thickness) and the lateral width of each waveguide core 26 may respectively be not less than about 1 μm and not more than about 10 μm, for example. A cross section of each waveguide core 26 perpendicular to the waveguiding direction has a schematically rectangular shape. Alternatively, this cross section may have a circular or elliptical shape. The waveguide cores 26 have a larger size in the case where waveguiding is performed in multi-mode than in the case where waveguiding is performed in single-mode. In the present embodiment, the size of the waveguide cores 26 is chosen so as to achieve waveguiding in single-mode. For example, when the light has a wavelength of 455 nm, the height and the lateral width of each waveguide core 26 may both be not less than 1 μm and not more than 3 μm.

As can be seen from FIG. 2A and FIG. 2B, the center-to-center distance between the first light-exiting end 24-1 and the second light-exiting end 24-2 is shorter than the center-to-center distance between the first light-incident end 22-1 and the second light-incident end. 22-2, whereas the center-to-center distance between the second light-exiting end 24-2 and the third light-exiting end 24-3 is shorter than the center-to-center distance between the second light-incident end 22-2 and the third light-incident end 22-3. The center-to-center distance between two adjacent light-exiting ends among the first light-exiting end 24-1, the second light-exiting end 24-2, and the third light-exiting end 24-3 corresponds to the center-to-center distance between two adjacent emission points on the light-exiting surface 240 of the PLC 200. The center-to-center distance between two emission points may be not less than 2 μm and not more than 200 μm, and preferably not less than 2 μm and not more than 100 μm, for example.

Using the PLC 200 as such allows the center-to-center distance between two emission points on the light-exiting surface 240 of the PLC 200 to be smaller than the smaller possible value (e.g. 250 μm) of center-to-center distance between two laser diodes 10 that is determined by the device size and/or the mounding margin. Reducing the center-to-center distance between emission points eliminates the need to use a plurality of lenses to collimate light beams exiting at the respective emission points, and permits collimation through a single lens. This is because the plurality of emission points can be placed near the optical axis of the lens. In the example of FIG. 1, if no lens is present between the plurality of laser diodes 10 and the light incident surface 220 of the PLC 200, only a gap of e.g. 10 μm or less exists. For downsizing purposes, it is desirable that the laser diodes 10 be placed in the proximity of the light incident surface 220 of the PLC 200. Such structures are advantageous when a light emitting device according to the present disclosure is utilized as a light source for a head-mounted display or the like, because the head-mounted display or the like can be downsized. A light emitting device according to the present disclosure can be mounted on a temple of a head-mounted display in the form of eyeglasses, for example. An optical element such as a microlens may be placed between each laser diodes 10 and the corresponding optical waveguide 20. In the case where downsizing of the light emitting device is not necessary, light emitted from each laser diodes 10 may be coupled to the optical waveguide 20 through an optical fiber.

Figure 3:
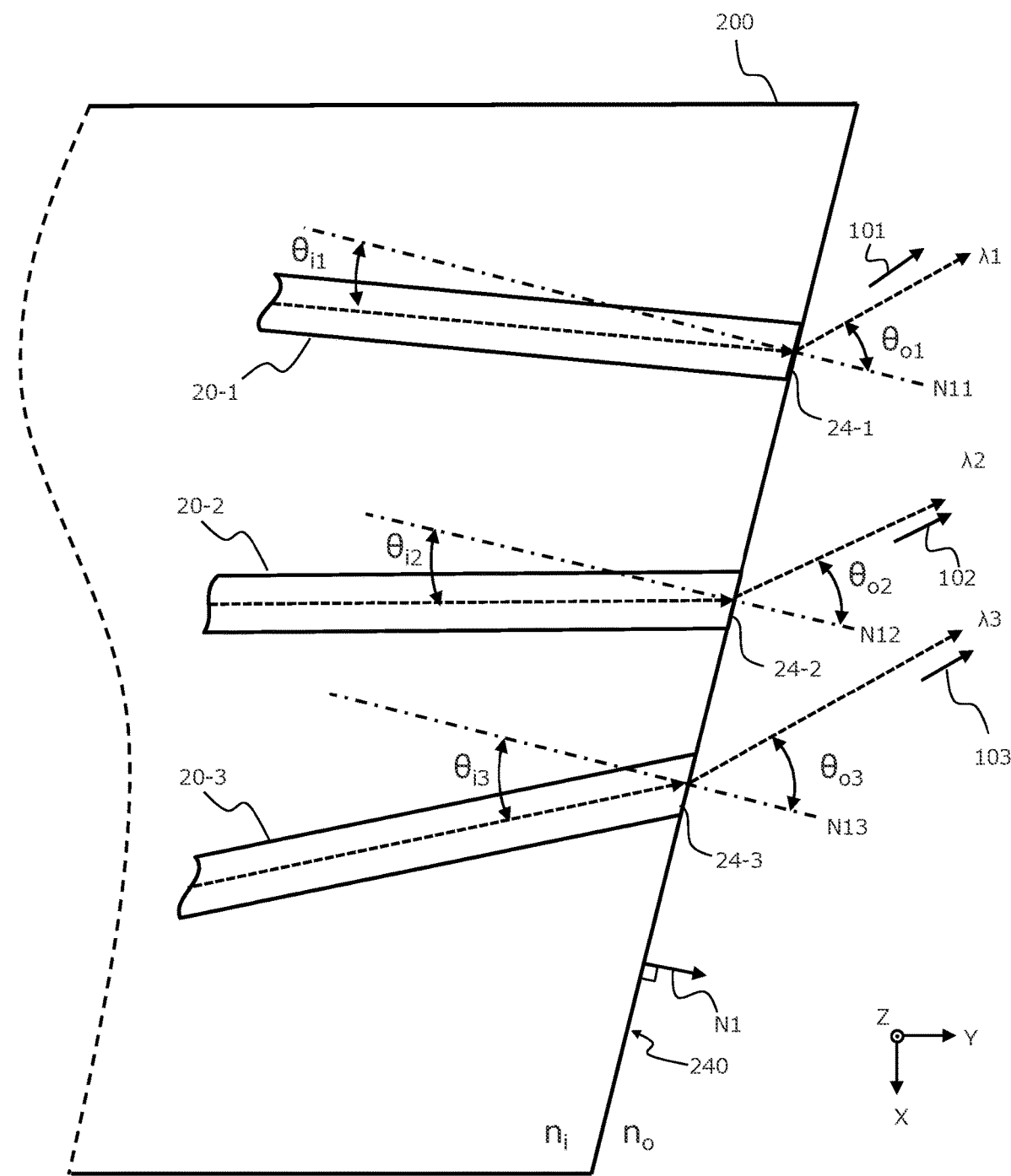
FIG. 3 is a plan view schematically showing a manner in which light is emitted from and refracted at a plurality of light-exiting ends of the PLC according to an embodiment.

Next, FIG. 3 is referred to FIG. 3 is a plan view schematically showing a manner in which light is emitted from and refracted at the light-exiting ends 24-1, 24-2 and 24-3 of the PLC 200 of the present embodiment. In the present embodiment, the first light-exiting end 24-1 causes refraction such that the first light exits in a first direction 101 which is inclined with respect to a normal direction N11 of the first light-exiting end 24-1. The second light-exiting end 24-2 causes refraction such that the second light exits in a second direction 102 which is inclined with respect to a normal direction N12 of the second light-exiting end 24-2. The third light-exiting end 24-3 causes refraction such that the third light exits in a third direction 103 which is inclined with respect to a normal direction N13 of the third light-exiting end 24-3. In the example of FIG. 3, the normal directions N11, N12 and N13 are parallel to one another. Although the light-exiting surface 240 is desirably a plane, the light-exiting surface 240 does not need to be a plane, but an angle of 10 degrees less may exist between any two of the normal directions N11, N12 and N13.

In the plan view of FIG. 3, the waveguiding direction of the first optical waveguide 20-1 intersects the normal direction N11 of the first light-exiting end 24-1 at a first angle $\theta_{i1}$, whereas the waveguiding direction of the second optical waveguide 20-2 intersects the normal direction N12 of the second light-exiting end 24-2 at a second angle $\theta_{i2}$. The first angle $\theta_{i1}$ is smaller than the second angle $\theta_{i2}$. The waveguiding direction of the third optical waveguide 20-3 intersects the normal direction N13 of the third light-exiting end 24-3 at a third angle $\theta_{i3}$, such that the second angle. $\theta_{i2}$ is smaller than the third angle $\theta_{i3}$. The first angle $\theta_{i1}$, the second angle $\theta_{i2}$, and the third angle $\theta_{i3}$ are all greater than 0 degrees and smaller than the total reflection angle.

The light which has been guided through the first optical waveguide 20-1 is refracted at a solid-air interface at the first light-exiting end 24-1, thereby changing its direction of propagation. Similarly, the light which has been guided through the second optical waveguide 20-2 and the third optical waveguide 20-3 is refracted at the respective solid-air interfaces at the second light-exiting end 24-2 and the third light-exiting end 24-3, thereby changing their directions of propagation.

Let the angle between the light exiting from the first light-exiting end 24-1 and the normal direction N11 of the first light-exiting end 24-1 be $\theta_{o1}$. Similarly, let the angle between the light exiting from the second light-exiting end 24-2 and the normal direction N12 of the second light-exiting end 24-2 be $\theta_{o2}$. Similarly, let the angle between the light exiting from the third light-exiting end 24-3 and the normal direction N13 of the third light-exiting end 24-3 be $\theta_{o3}$. Then, the following relationships hold true, according to Snell's law:

$\sin \theta_{o1} = (\sin \theta_{i1}) n_{i(\lambda 1)}/n_o;$ $\sin \theta_{o2} = (\sin \theta_{i2}) n_{i(\lambda 2)}/n_o;$ and $\sin \theta_{o3} = (\sin \theta_{i3}) n_{i(\lambda 3)}/n_o.$ Herein, $n_{i(\lambda)}$ is a refractive index (e.g. 1.4 to 2.0) of each optical waveguide 20 at a wavelength λ, whereas $n_o$ is a refractive index of the gas material (which may typically be air). The optical waveguides 20 do not need to be made of the same material. When they are made of the same material, however, the light that is guided through the respective optical waveguides 20 has different wavelengths, and therefore the refractive index $n_{i(\lambda)}$ is dependent on the wavelength. When the material has normal dispersion, $n_{i(\lambda 1)} > n_{i(\lambda 2)} > n_{i(\lambda 3)}$ holds because λ1<λ2<λ3. In such a case, since $\theta_{i1} < \theta_{i2} < \theta_{i3}$ in the present embodiment, it is possible to bring $\theta_{o1}$, $\theta_{o2}$ and $\theta_{o3}$ close to one another. In the case where the material of optical waveguides 20 does not have any wavelength dispersion, or where the wavelength dispersion is negligible, $\theta_{o1}$, $\theta_{o2}$ and $\theta_{o3}$ will be equal in magnitude when $\theta_{i1}$, $\theta_{i2}$ and $\theta_{i3}$ are equal in magnitude.

Thus, by adjusting the $\theta_{i1}$, $\theta_{i2}$ and $\theta_{i3}$ on the basis of the refractive index of each optical waveguide 20, becomes possible to control $\theta_{o1}$, $\theta_{o2}$ and $\theta_{o3}$. In other words, the directions of light beams exiting from the first light-exiting end 24-1, the second light-exiting end 24-2, and the third light-exiting end. 24-3 can be controlled. In the example of FIG. 3, the first direction 101, the second direction 102, and the third direction 103 are parallel to one another, and are oriented in the same direction.

Figure 4:
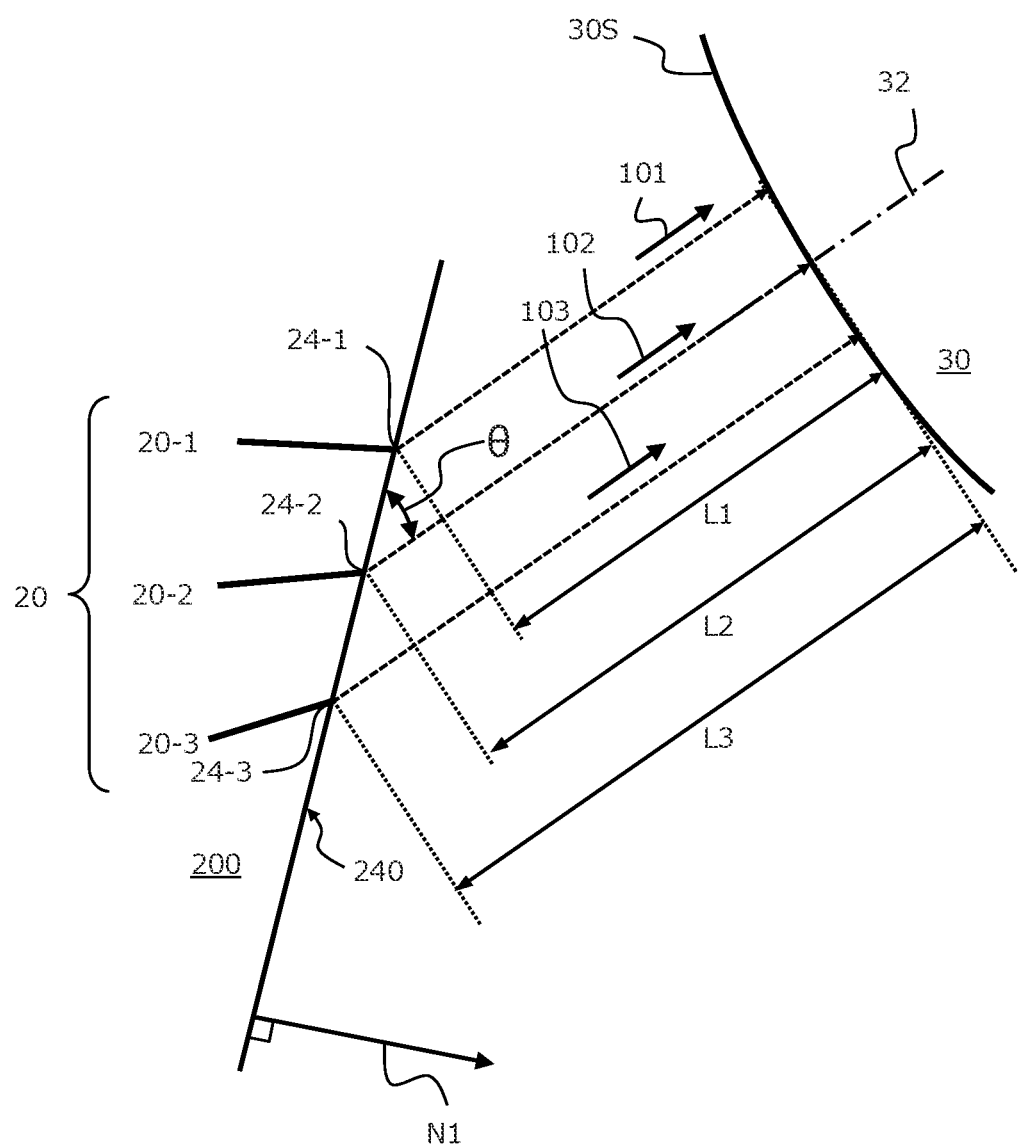
FIG. 4 is a plan view showing a relationship between distances from the plurality of light-exiting ends of the PLC to the surface of a lens according to an embodiment.

Next, FIG. 4 is referred to FIG. 4 is a plan view showing a relationship between distances from the plurality of light-exiting ends of the PLC to the surface 30S of the lens 30 according to an embodiment.

As shown in FIG. 4, in the structure according to the present embodiment, a first distance L1 from the first light-exiting end 24-1 to the surface 30S of the lens 30 along the first direction 101 is shorter than a second distance L2 from the second light-exiting end 24-2 to the surface 30S of the lens 30 along the second direction 102. Moreover, the second distance L2 from the second light-exiting end 24-2 to the surface 30S of the lens 30 along the second direction 102 is shorter than third distance L3 from the third light-exiting end 24-3 to the surface 30S of the lens 30 along the third direction 103. In the illustrated example, the focal length of the lens 30 takes different values depending on the wavelength λ of light. In the illustrated example, the shorter the light wavelength λ is, the shorter the focal length of the lens 30 is. According to the present embodiment, the optical axis direction 32 of the lens 30 is not parallel to the normal direction N1 of the light-exiting surface 240, but is inclined therefrom. In other words, the optical axis direction 32 of the lens 30 is inclined with respect to the light-exiting surface 240.

Now, let the angle of the optical axis direction 32 of the lens 30 with respect to the light-exiting surface 240 be θ. If the first direction 101 and the second direction 102 are substantially parallel, by approximation, L2−L1 is equal to a distance resulting from multiplying the center-to-center distance between the first light-exiting end 24-1 and the second light-exiting end 24-2 by cos θ. Similarly, if the second direction 102 and the third direction 103 are substantially parallel, by approximation, L3−L2 is equal to a distance resulting from multiplying the center-to-center distance between the second light-exiting end 24-2 and the third light-exiting end 24-3 by cos θ.

As will be appreciated from the above, by adjusting the center-to-center distances between adjacent light-exiting ends 24 and the angle θ, it becomes possible to match the distances L1, L2 and L3 to focal lengths which are suitable for the respective light wavelengths. As described above the emission-point pitch on the PLC 200 can be reduced to 200 μm or less. However, in order to set the distances L1, L2 and L3 to appropriate values in accordance with the focal length of the lens 30, it is necessary to appropriately adjust the distances expressed as L2-L1 and L3-L2, and the emission-point pitch is adjustable. In some cases, the emission-point pitch may be set to a value exceeding 200 μm.

For simplicity, the above description assumes that there are three laser diodes 10. Hereinafter, an example where there are six laser diodes 10 will be described.

Figure 5:
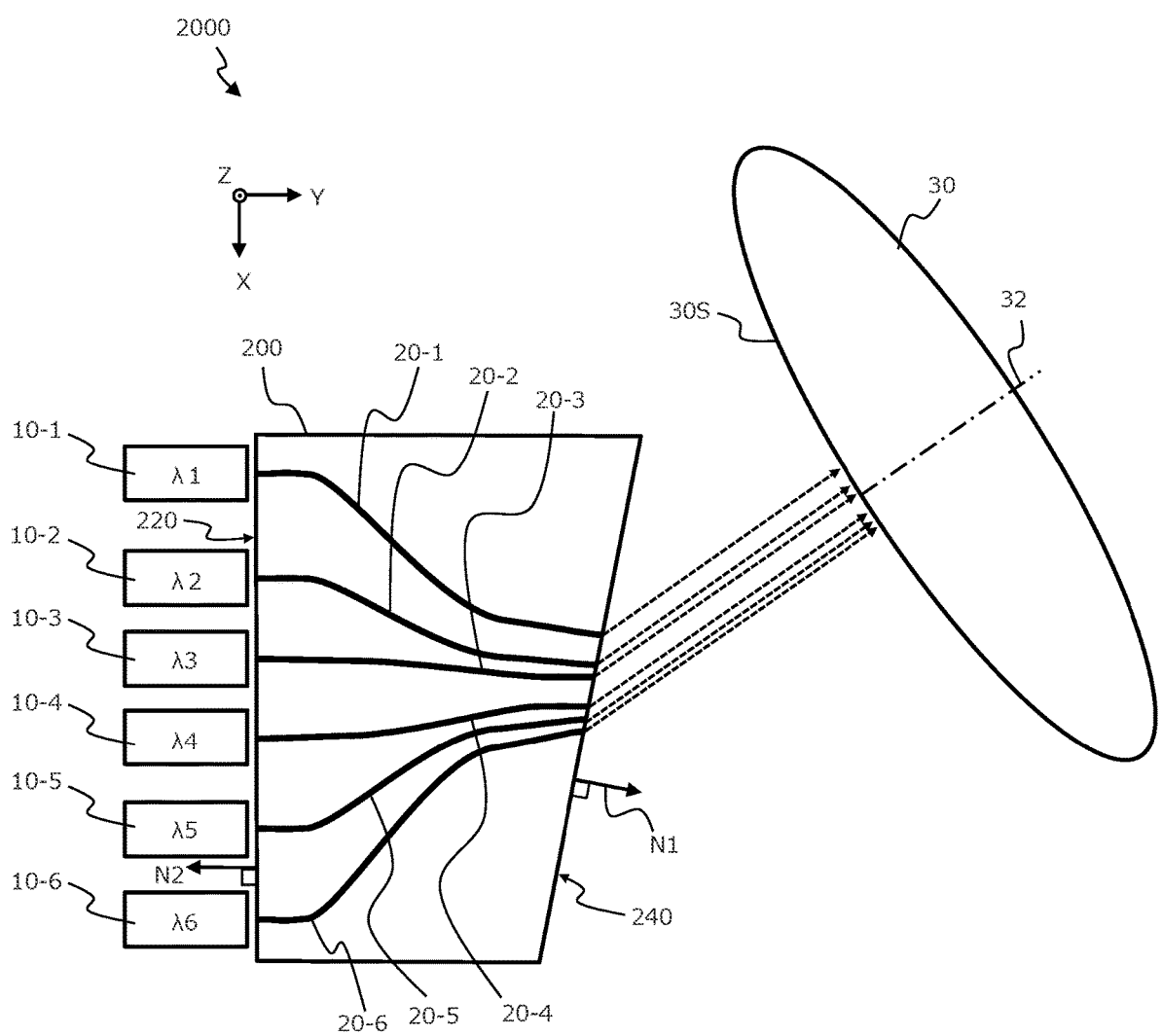
FIG. 5 is a plan view showing another example structure of a light emitting device according to an embodiment of the present disclosure.

FIG. 5 is a plan view showing another example structure of a light emitting device 2000 according to an embodiment of the present disclosure. The fundamental structure of the light emitting device 2000 is similar to that of the above-described light emitting device 1000.

The light emitting device 2000 according to the present embodiment includes six laser diodes 10 that are arranged along a predetermined direction (the X axis direction). In the illustrated example, the six laser diodes 10 include a first laser diode 10-1, a second laser diode 10-2, a third laser diode 10-3, a fourth laser diode 10-4, a fifth laser diode 10-5, and a sixth laser diode 10-6. Hereinafter, these laser diodes may be represented by the reference numeral "10-N", where "N" is an integer which is 1 or greater. The lasing peak wavelength of a laser diode 10-N is denoted as "λN".

In the light emitting device 2000, the relationship λ1<λ2<λ3<λ4<λ5<λ6 holds for the lasing peak wavelengths. As each laser diode 10, for example, a laser diode to radiate blue light, a laser diode to radiate green light, a laser diode to radiate red light, or the like may be adopted. Also, a laser diode to radiate light of a color other than blue, green, and red, e.g., ultraviolet or infrared, may be adopted.

In the present specification, blue light refers to light which falls within an emission peak wavelength range from 420 nm to 494 nm. Green light refers to light which falls within an emission peak wavelength range from 495 nm to 570 nm. Red light refers to light which falls within an emission peak wavelength range from 605 nm to 750 nm.

Examples of laser diodes emitting blue light or laser diodes emitting green light may be laser diodes containing a nitride semiconductor. As the nitride semiconductor, for example, GaN, InGaN, or AlGaN may be used. Examples of laser diodes emitting red light may be those containing an InAlGaP-based, GaInP-based, GaAs-based, or AlGaAs-based semiconductor.

In the light emitting device 2000 according to the present embodiment, for example, λ1 is in the range of 420 nm to 494 nm, λ2 and λ3 are in the range of 495 nm to 570 nm, and λ4, λ5 and λ6 are in the range of 605 nm to 750 nm. In other words, any one or more of the blue, green, and red light emitted from the laser diodes 10 may contain two kinds of light components of different peak wavelengths.

The light emitting device 2000 further includes: a PLC 200 that includes a plurality of optical waveguides 20-N to guide light emitted from the plurality of laser diodes 10-N; and a lens 30 to which the light exiting from the plurality of optical waveguides 20-N is incident. Since each optical waveguide 20 and the lens 30 have structures as described above, the description thereof is omitted.

Figure 6A:
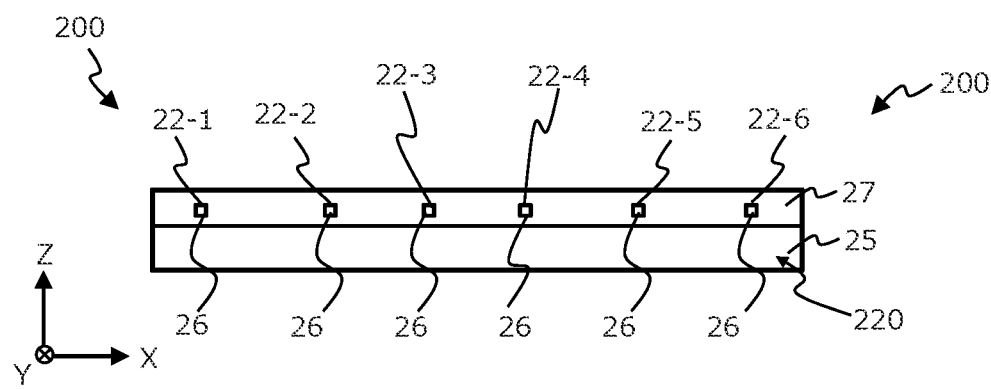
FIG. 6A is a diagram showing a light incident surface, in which the PLC of the light emitting device of FIG. 5 is viewed from the negative direction of the Y axis.
Figure 6B:
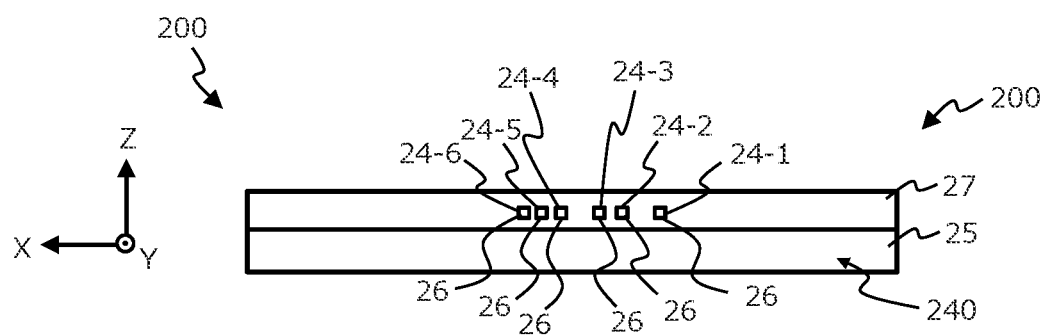
FIG. 6B is a diagram showing a light-exiting surface, in which the PLC of the light emitting device of FIG. 5 is viewed from the positive direction of the Y axis.

FIG. 6A is a diagram showing the light incident surface 220, in which the PLC 200 is viewed from the negative direction of the Y axis. FIG. 6B is a diagram showing the light-exiting surface 240, in which the PLC 200 is viewed from the positive direction of the Y axis. A protective film or an antireflection coating may be provided on at least one of the light incident surface 220 and the light-exiting surface 240.

In this example, the $N^{th}$ optical waveguide 20-N receives $N^{th}$ light that is emitted from an $N^{th}$ laser diode 10-N at an $N^{th}$ light-incident end 22-N, and emits the $N^{th}$ light at an $N^{th}$ light-exiting end 24-N. It is desirable that the beams of light exiting from the N light-exiting ends 24 are oriented in a parallel direction to the optical axis direction 32 of the lens 30.

According to the present embodiment, even in the case where laser light is emitted from six emission points, the emission points can be kept within a narrow geometrical range. Moreover, for laser light beams of multiple wavelengths having different peak wavelengths across a broad range in the visible light region, their emission points can be kept close to the focal point of the lens 30. In the present embodiment, an offset of 5 μm to 100 μm can be introduced between the distance from the first light-exiting end 24-1 to the surface 30S of the lens 30 and the distance from the sixth light-exiting end 24-6 to the surface 30S of the lens 30, in accordance with the different focal lengths associated with different peak wavelengths. As a result, laser beams of different colors can be suitably collimated through the same lens 30.

In the Light emitting device 2000, the relationship $\lambda 1 < \lambda 2 < \lambda 3 < \lambda 4 < 5 < \lambda 6$ holds for the lasing peak wavelengths; however, it is not necessary that Fill laser diodes 10 differ in lasing wavelength. For example, the relationship $\lambda 1 < \lambda 2 = \lambda 3 < \lambda 4 = \lambda 5 = \lambda 6$ may hold. In this case, the laser diodes 10-1 and 10-2 radiate blue light. Moreover, the laser diodes 10-3 and 10-4 radiate green light, whereas the laser diodes 10-5 and 10-6 radiate red light. Note that the plurality of laser diodes 10 may include a laser diode (s) that radiates infrared light.

Figure 7:
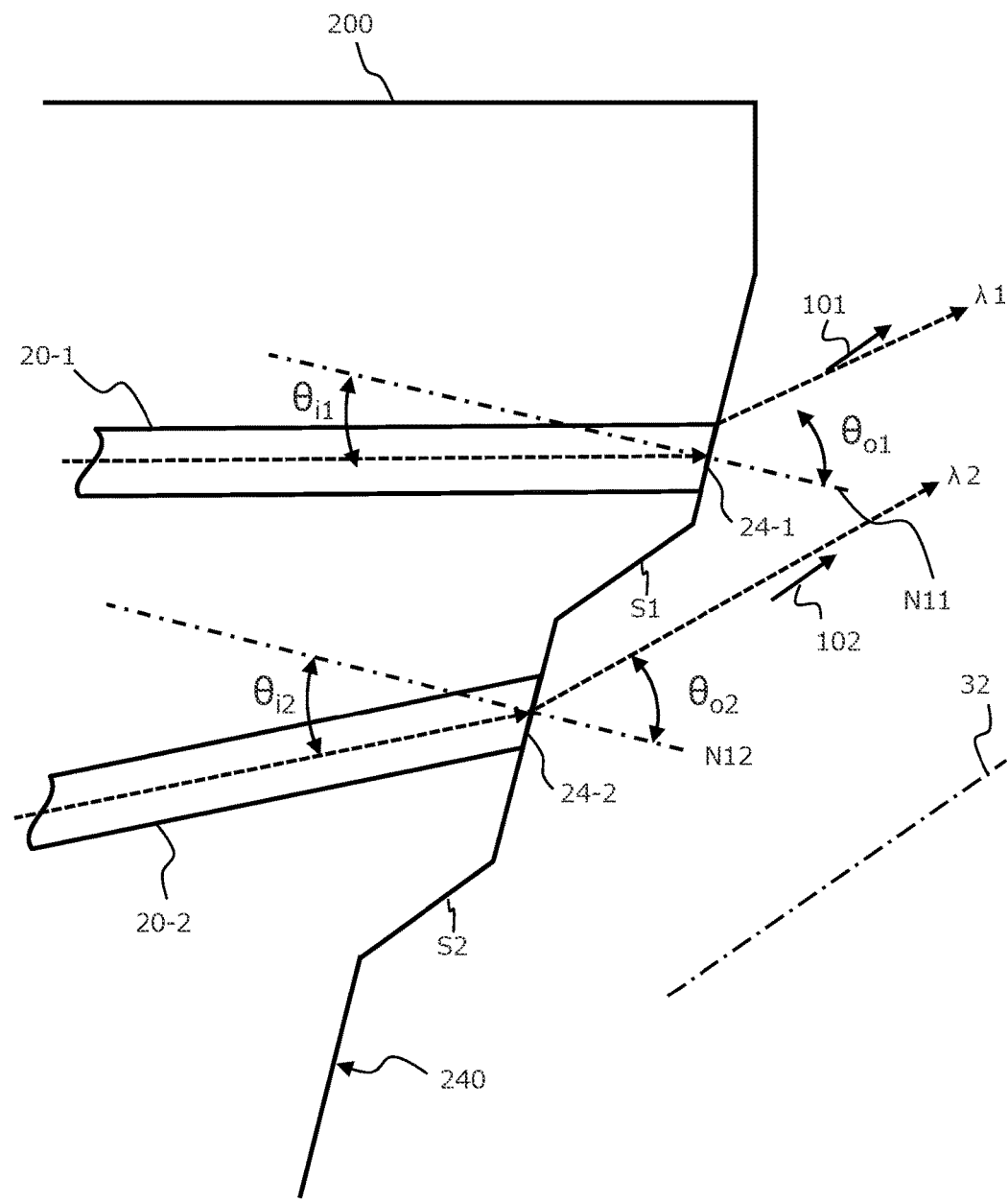
FIG. 7 is a plan view showing a part of a variation of the PLC according to an embodiment of the present disclosure.

FIG. 7 is a plan view showing a part of a variation of the PLC 200. In a plan view, the light-exiting surface 240 of the PLC 200 may include one or more steps. In the example of FIG. 7, in the illustrated region, the light-exiting surface 240 includes a step S1 and a step S2. The steps S1 and S2 are formed as a result of portions of the light-exiting surface 240 being offset along the optical axis direction 32 of the lens 30. The step S1 existing between the first light-exiting end 24-1 and the second light-exiting end 24-2 allows the distance from the second light-exiting end 24-2 to the surface 30S of the lens 30 to become much longer than the distance from the first light-exiting end 24-1 to the surface 30S of the lens 30. The amount of offset along the optical axis direction 32 of the lens 30 that is created by each of the steps S1 and S2 may be not less than 5 μm and not more than 100 μm, for example.

In the example of FIG. 7, the normal direction N11 of the first light-exiting end 24-1 and the normal direction N12 of the second light-exiting end 24-2 are parallel to each other; however, according to an embodiment of the present disclosure, the normal directions N11 and N12 do not need to be parallel to each other. Moreover, the directions 101 and 102 of the respective light beams exiting from the light-exiting ends 24-1 and 24-2 do not need to be parallel to the optical axis direction 32 of the lens 30, either. Given that each emission point (i.e., the center of a light-exiting end 24-N) is disposed at a close position to the focal point of the lens 30, appropriate collimation can be achieved even if the light beam from each emission point is in a different direction, so long as the light beam exiting from each emission point is incident within the effective diameter of the lens 30. This is because the lens functions to cause the bundle of rays diverging from the emission points near the focal point to become, by approximation, parallel. Therefore, when the center-to-center distances between the light-exiting ends 24-1, 24-2 and 24-3 are reduced and each emission point lies close to the focal point of the lens 30 in accordance with their respective color, the first direction 101, the second direction 102, and the third direction 103 do not need to be the same direction.

Figure 8:
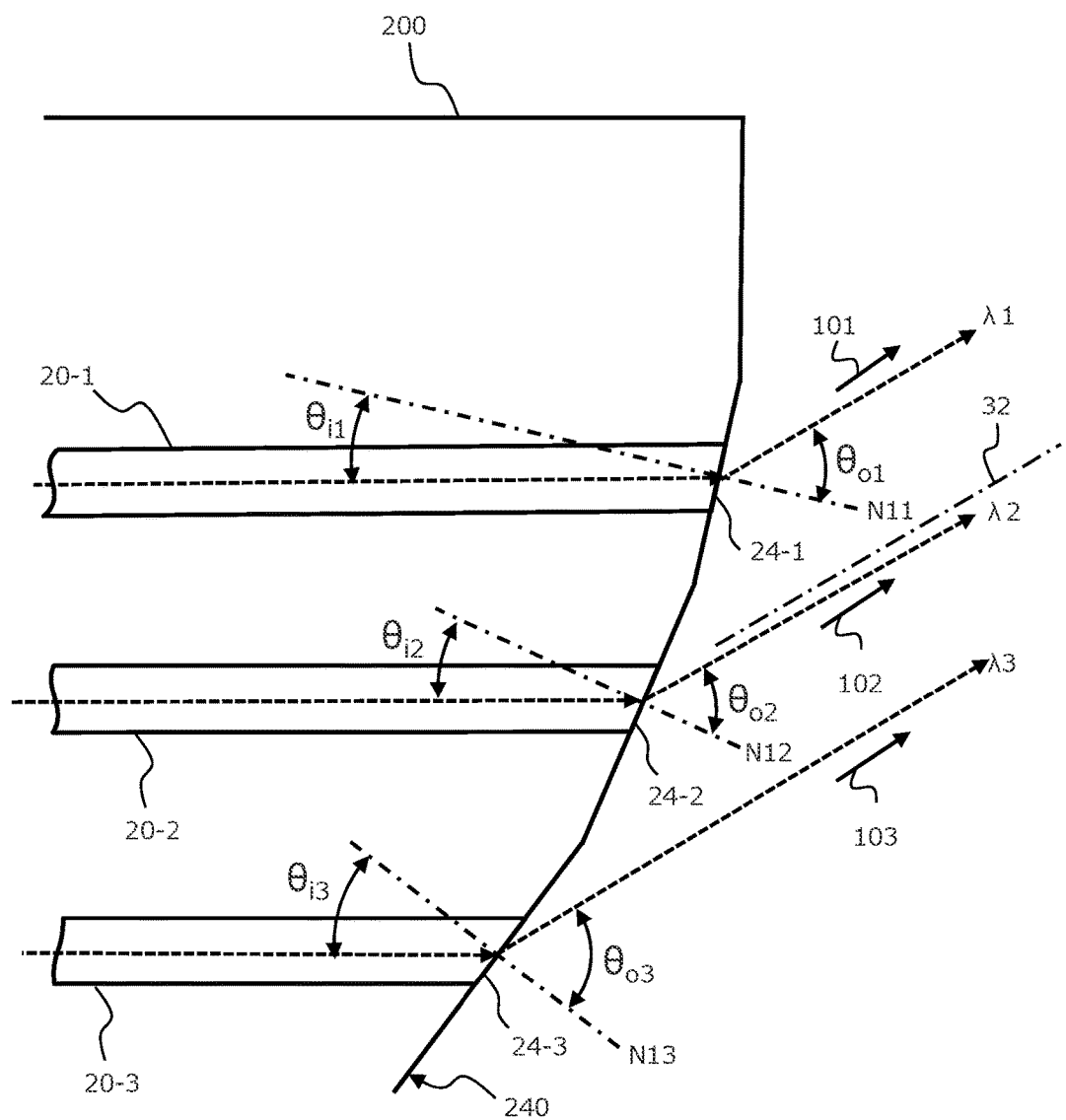
FIG. 8 is a plan view showing a part of another variation of the PLC according to an embodiment of the present disclosure.

FIG. 8 is a plan view showing a part of another variation of the PLC 200. The light-exiting surface 240 of the PLC 200 is composed of a plurality of planar regions such that the normal direction N1$n$ of each $n^{th}$ light-exiting end 24-$n$ is oriented in a different direction. In the example of FIG. 8, because the second light-exiting end 24-2 is inclined with respect to the first light-exiting end 24-1, the distance from the second light-exiting end 24-2 to the surface 30S of the lens 30 can be made longer than the distance from the first light-exiting end 24-1 to the surface 30S of the lens 30. Similarly, because the third light-exiting end 24-3 is inclined with respect to the second light-exiting end 24-2, the distance from the third light-exiting end 24-3 to the surface 30S of the lens 30 can be made longer than the distance from the second light-exiting end 24-2 to the surface 30S of the lens 30.

Figure 9:
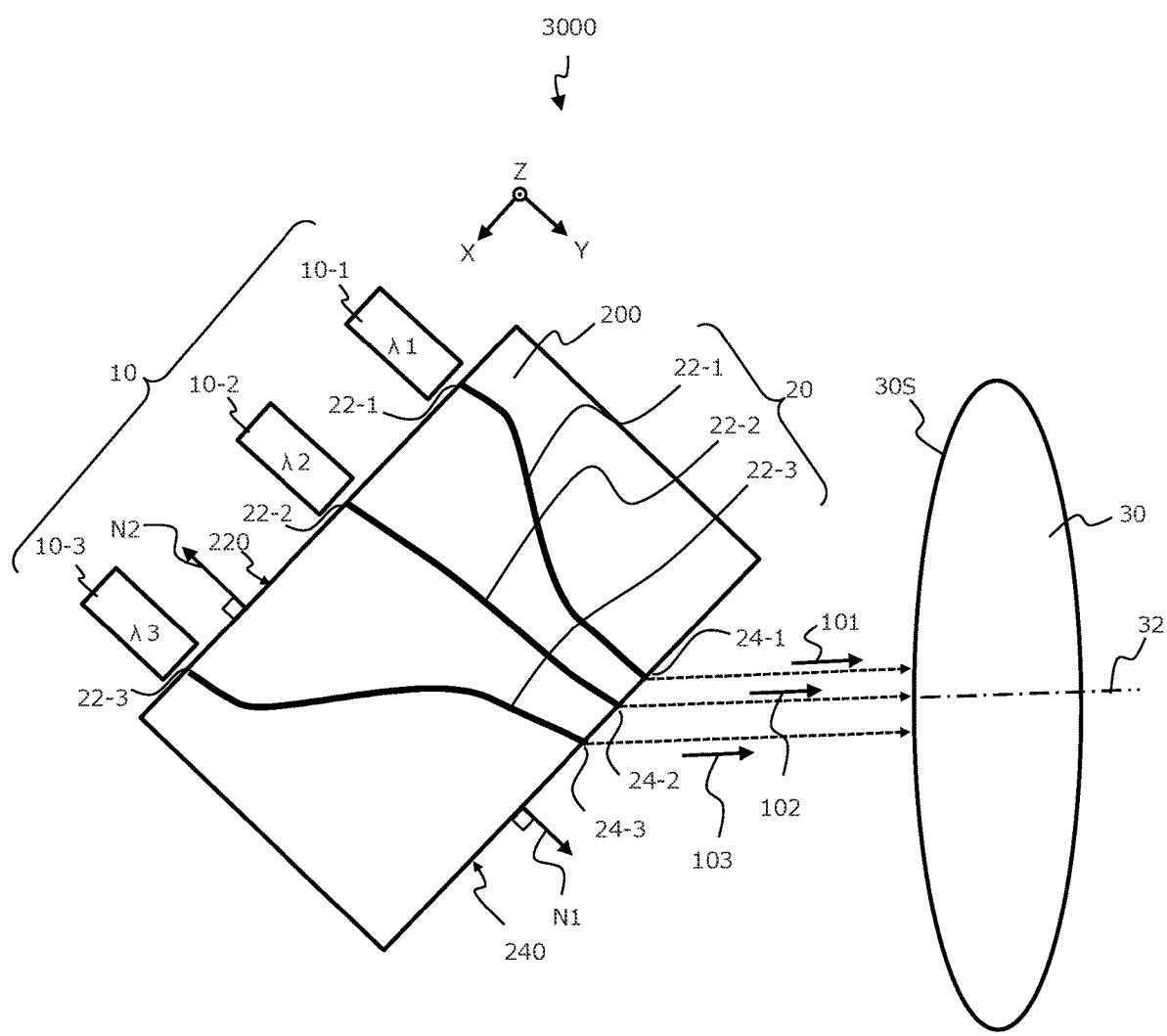
FIG. 9 is a plan view showing still another example structure of a light emitting device according to an embodiment of the present disclosure.

FIG. 9 is a plan view showing still another example structure of a light emitting device according to an embodiment of the present disclosure. In the example of FIG. 9, the normal direction N1 of the light-exiting surface 240 and the normal direction N2 of the light incident surface 220 of the PLC 200 are parallel. In the present embodiment, as the substrate of the PLC 200, a rectangular-shaped substrate can be adopted. The PLC 200 of the shape and size in a plan view can be arbitrary.

The light emitting device according to any of the above-described embodiments may include a package within which the plurality of laser diodes 10 and the PLC 200 are sealed.

Figure 10:
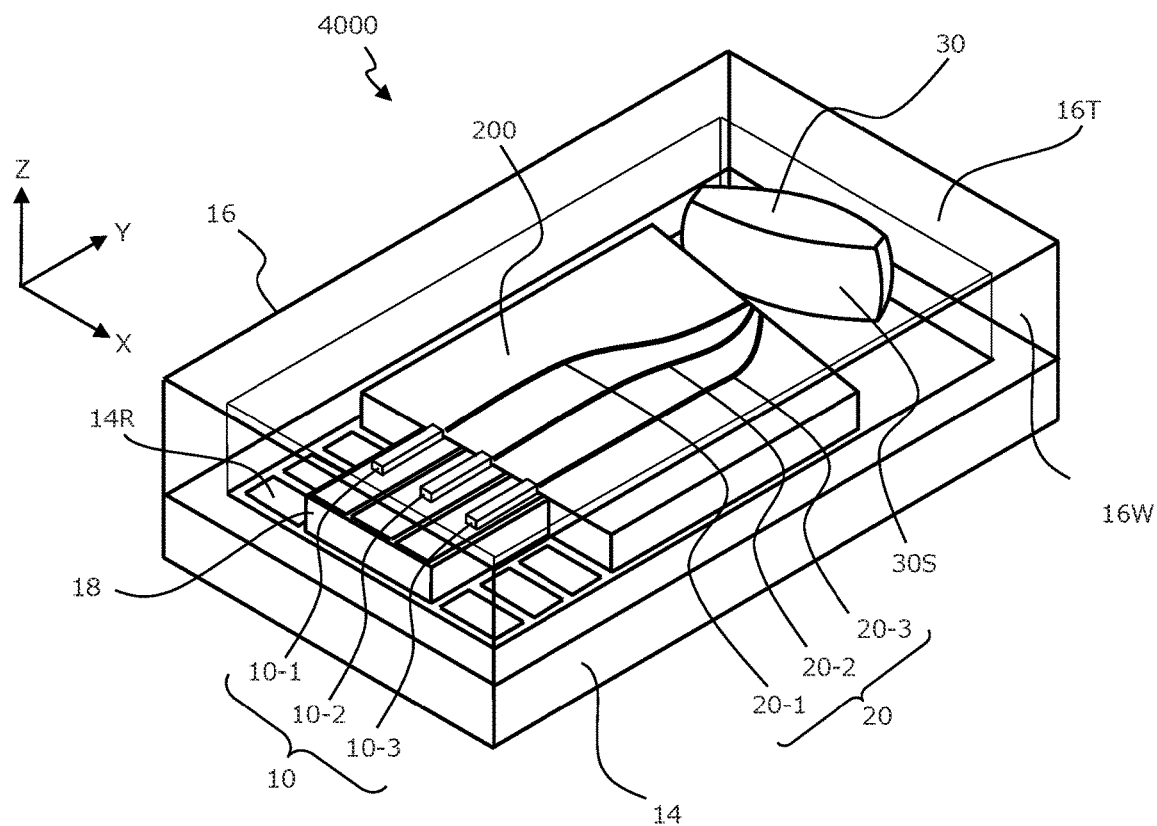
FIG. 10 is a perspective view showing still another example structure of a light emitting device according to an embodiment of the present disclosure.
Figure 11:
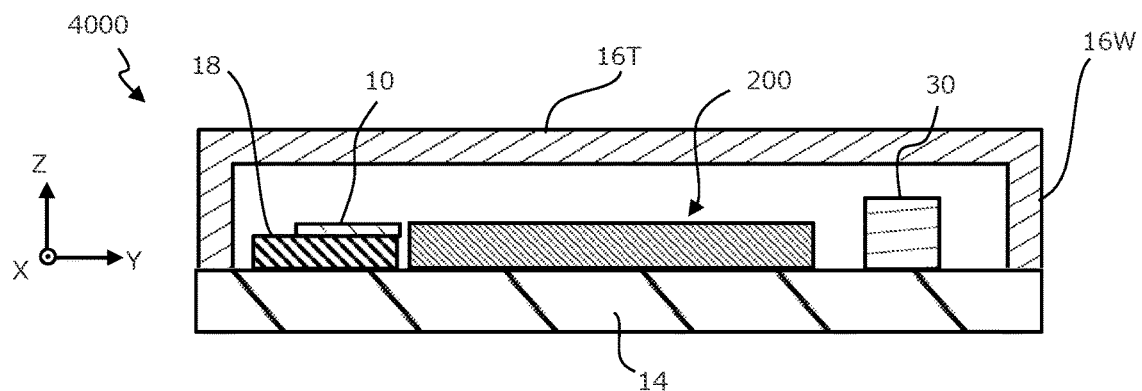
FIG. 11 is cross-sectional view schematically showing a cross section of the light emitting device of FIG. 10 which is parallel to the YZ plane.

FIG. 10 is a perspective view showing an example of a light emitting device 4000 having a package structure within which the plurality of laser diodes 10, the PLC 200, and the lens 30 are sealed. FIG. 11 is a diagram schematically showing a cross section of the light emitting device 4000 of EEG. 10 which is parallel to the YZ plane. The light emitting device 4000 includes: a supporting substrate 14 supporting the plurality of laser diodes 10, the PLC 200, and the lens 30; and a cap member 16 covering the plurality of laser diodes 10, the PLC 200, and the lens 30. The supporting substrate 14 and the cap member 16 function as a package to hermetically seal the laser diodes 10, the PLC 200, and the lens 30 being housed therein. More specifically, the cap member 16 includes wall surface portions 16W that are bonded to the supporting substrate 14, and an upper-surface portion 16T opposed to the supporting substrate 14. The wall surface portions 16W of the cap member 16 surround the plurality of laser diodes 10, the PLC 200, and the lens 30 on the supporting substrate 14. Some or all of the wall surface portions 16W are made of a light-transmissive material that transmits light having been collimated or converged by the lens 30, thus allowing the light transmitted through the lens 30 to exit from the light emitting device 4000 to the outside.

In the examples shown in FIG. 10 and FIG. 11, the plurality of laser diodes 10 are supported on a submount 18. The thickness of the submount 18 may be chosen so that light emitted from the laser diodes 10 is appropriately incident on the light-incident end of the PLC 200.

Although there are three laser diodes 10 in the illustrated example, the light emitting device 4000 may include four or more laser diodes 10.

The light emitting device according to the present disclosure can be suitably used as a light source of a head-mounted display, a projector, or the like.

What is claimed is:

1. A light emitting device comprising:
a plurality of laser diodes aligned along a predetermined direction, the plurality of laser diodes including
a first laser diode configured to oscillate at a first peak wavelength to emit first light, and
a second laser diode configured to oscillate at a second peak wavelength to emit second light, the second peak wavelength being longer than the first peak wavelength;
a planar lightwave circuit including
a first optical waveguide configured to receive the first light at a first light-incident end, to guide the first light, and to emit the first light from a first light-exiting end with the first light being refracted at the first light-exiting end to exit in a first direction which is inclined with respect to a normal direction of the first light-exiting end, and
a second optical waveguide configured to receive the second light at a second light-incident end, to guide the second light, and to emit the second light from a second light-exiting end with the second light being refracted at the second light-exiting end to exit in a second direction which is inclined with respect to a normal direction of the second light-exiting end,
a center-to-center distance between the first light-exiting end and the second light-exiting end being shorter than a center-to-center distance between the first light-incident end and the second light-incident end; and
a lens to which the first light exiting from the first light-exiting end and the second light exiting from the second light-exiting end are incident, the lens being arranged with respect to the planar lightwave circuit so that a first distance from the first light-exiting end to a surface of the lens along the first direction is shorter than a second distance from the second light-exiting end to the surface of the lens along the second direction,
wherein,
in a plan view, a waveguiding direction of the first optical waveguide intersects the normal direction of the first light-exiting end at a first angle, and a waveguiding direction of the second optical waveguide intersects the normal direction of the second light-exiting end at a second angle, the first angle being smaller than the second angle.

2. The light emitting device of claim 1, wherein
the first direction and the second direction are parallel to each other.

3. The light emitting device of claim 1, wherein
an optical axis direction of the lens is inclined with respect to the predetermined direction.

4. The light emitting device of claim 1, wherein
The center-to-center distance between the first light-exiting end and the second light-exiting end is equal to or greater than 2 μm, and equal to or less than 200 μm.

5. A light emitting device comprising:
a plurality of laser diodes aligned along a predetermined direction, the plurality of laser diodes including
a first laser diode configured to oscillate at a first peak wavelength to emit first light, and
a second laser diode configured to oscillate at a second peak wavelength to emit second light, the second peak wavelength being longer than the first peak wavelength;
a planar lightwave circuit including
a first optical waveguide configured to receive the first light at a first light-incident end, to guide the first light, and to emit the first light from a first light-exiting end with the first light being refracted at the first light-exiting end to exit in a first direction which is inclined with respect to a normal direction of the first light-exiting end, and
a second optical waveguide configured to receive the second light at a second light-incident end, to guide the second light, and to emit the second light from a second light-exiting end with the second light being refracted at the second light-exiting end to exit in a second direction which is inclined with respect to a normal direction of the second light-exiting end,
a center-to-center distance between the first light-exiting end and the second light-exiting end being shorter than a center-to-center distance between the first light-incident end and the second light-incident end; and
a lens to which the first light exiting from the first light-exiting end and the second light exiting from the second light-exiting end are incident, the lens being arranged with respect to the planar lightwave circuit so that a first distance from the first light-exiting end to a surface of the lens along the first direction is shorter than a second distance from the second light-exiting end to the surface of the lens along the second direction,
wherein,
the plurality of laser diodes further include a third laser diode configured to oscillate at a third peak wavelength to emit third light, the third peak wavelength being longer than the second peak wavelength,
the plurality of optical waveguides further include a third optical waveguide configured to receive the third light at a third light-incident end, to guide the third light, and to emit the third light from a third light-exiting end with the third light being refracted at the third light-exiting end to exit in a third direction which is inclined with respect to a normal direction of the third light-exiting end,
a center-to-center distance between the second light-exiting end and the third light-exiting end is shorter than a center-to-center distance between the second light-incident end and the third light-incident end, and
the second distance is shorter than a third distance from the third light-exiting end to the surface of the lens along the third direction.

6. The light emitting device of claim 5, wherein
the first direction, the second direction, and the third direction are parallel to each other.

7. The light emitting device of claim 5, wherein
the first peak wavelength, the second peak wavelength, and the third peak wavelength are all in a visible light region.

8. The light emitting device of claim 5, wherein
the plurality of laser diodes further include a fourth laser diode configured to oscillate at a fourth peak wavelength to emit fourth light, the fourth peak wavelength being different from any of the first peak wavelength, the second peak wavelength, and the third peak wavelength, and the plurality of optical waveguides further include a fourth optical waveguide configured to receive the fourth light at a fourth light-incident end, to guide the fourth light, and to emit the fourth light from a fourth light-exiting end.

9. The light emitting device of claim 8, wherein
the first peak wavelength, the second peak wavelength, the third peak wavelength, and the fourth peak wavelength are all in a visible light region.

10. The light emitting device of claim 8, wherein
the fourth peak wavelength is in a range of 780 nm to 2000 nm.

11. The light emitting device of claim 5, wherein
the first peak wavelength is in a range of 400 nm to 495 nm,
the second peak wavelength is in a range of 495 nm to 600 nm, and
the third peak wavelength is in a range of 600 nm to 750 nm.

12. The light emitting device of claim 5, wherein
the first direction and the second direction are parallel to each other.

13. The light emitting device of claim 5, wherein
an optical axis direction of the lens is inclined with respect to the predetermined direction.

14. The light emitting device of claim 5, wherein
the center-to-center distance between the first light-exiting end and the second light-exiting end is equal to or greater than 2 µm, and equal to or less than 200 µm.

15. The light emitting device of claim 1, wherein
a portion of the first optical waveguide adjacent to the first light-exiting end and a portion of the second optical waveguide adjacent to the second light-exiting end are non-parallel to each other.

16. A light emitting device comprising:
a plurality of laser diodes aligned along a predetermined direction, the plurality of laser diodes including
  a first laser diode configured to oscillate at a first peak wavelength to emit first light, and
  a second laser diode configured to oscillate at a second peak wavelength to emit second light, the second peak wavelength being longer than the first peak wavelength;
a planar lightwave circuit including
  a first optical waveguide configured to receive the first light at a first light-incident end, to guide the first light, and to emit the first light from a first light-exiting end with the first light being refracted at the first light-exiting end to exit in a first direction which is inclined with respect to a normal direction of the first light-exiting end, and
  a second optical waveguide configured to receive the second light at a second light-incident end, to guide the second light, and to emit the second light from a second light-exiting end with the second light being refracted at the second light-exiting end to exit in a second direction which is inclined with respect to a normal direction of the second light-exiting end,
  a center-to-center distance between the first light-exiting end and the second light-exiting end being shorter than a center-to-center distance between the first light-incident end and the second light-incident end; and
a lens to which the first light exiting from the first light-exiting end and the second light exiting from the second light-exiting end are incident, the lens being arranged with respect to the planar lightwave circuit so that a first distance from the first light-exiting end to a surface of the lens along the first direction is shorter than a second distance from the second light-exiting end to the surface of the lens along the second direction,
wherein:
the planar lightwave circuit includes
  a light incident surface that includes the first light-incident end and the second light-incident end, and
  a light-exiting surface that includes the first light-exiting end and the second light-exiting end, and
a normal direction of the light-exiting surface is inclined with respect to an optical axis direction of the lens, and
in a plan view, the light-exiting surface of the planar lightwave circuit defines one or more steps.

17. The light emitting device of claim 16, wherein
the first direction and the second direction are parallel to each other.

18. The light emitting device of claim 16, wherein
an optical axis direction of the lens is inclined with respect to the predetermined direction.

19. The light emitting device of claim 16, wherein
The center-to-center distance between the first light-exiting end and the second light-exiting end is equal to or greater than 2 µm, and equal to or less than 200 µm.

* * * * *